US012033711B2

United States Patent
Varadarajan et al.

(10) Patent No.: US 12,033,711 B2
(45) Date of Patent: *Jul. 9, 2024

(54) BUILT-IN MEMORY REPAIR WITH REPAIR CODE COMPRESSION

(71) Applicant: TEXAS INSTRUMENTS INCORPORATED, Dallas, TX (US)

(72) Inventors: Devanathan Varadarajan, Allen, TX (US); Varun Singh, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/301,327

(22) Filed: Apr. 17, 2023

(65) Prior Publication Data

US 2023/0253062 A1    Aug. 10, 2023

Related U.S. Application Data

(63) Continuation of application No. 17/125,323, filed on Dec. 17, 2020, now Pat. No. 11,631,472.

(51) Int. Cl.
*G11C 29/16* (2006.01)
*G11C 29/40* (2006.01)
*G11C 29/44* (2006.01)

(52) U.S. Cl.
CPC .......... *G11C 29/4401* (2013.01); *G11C 29/16* (2013.01); *G11C 29/40* (2013.01)

(58) Field of Classification Search
CPC ...... G11C 29/4401; G11C 29/40; G11C 29/16
See application file for complete search history.

(56) References Cited

U.S. PATENT DOCUMENTS

| 6,574,757 | B1 | 6/2003 | Park et al. |
| 6,651,202 | B1 | 11/2003 | Phan |
| 7,174,486 | B2 | 2/2007 | Adams et al. |
| 7,350,119 | B1 | 3/2008 | Zuraski, Jr. et al. |
| 9,053,799 | B2 | 6/2015 | Varadarajan et al. |
| 9,318,222 | B2 | 4/2016 | Varadarajan et al. |
| 9,852,810 | B2 | 12/2017 | Varadarajan et al. |
| 10,134,483 | B2 | 11/2018 | Varadarajan et al. |
| 10,600,495 | B2 | 3/2020 | Varadarajan et al. |

(Continued)

OTHER PUBLICATIONS

V. Sridhar, et al., "Built-in self-repair (BISR) technique widely Used to repair embedded random access memories (RAMs)" International Journal of Computer Science Engineering (IJCSE) vol. 1 No. 1 Sep. 2012; 19 pgs.

(Continued)

*Primary Examiner* — Mohammed A Bashar
(74) *Attorney, Agent, or Firm* — Michael T. Gabrik; Frank D. Cimino

(57) ABSTRACT

In a described example, an integrated circuit (IC) includes a repairable memory system. A repair controller is coupled to the repairable memory system. The repair controller includes compression logic configured to encode memory repair code data for a respective instance of the repairable memory system and provide compressed repair data. A non-volatile memory controller is coupled to the repair controller and to non-volatile memory. The non-volatile memory controller is configured to transfer the compressed repair data to the non-volatile memory for storage.

20 Claims, 5 Drawing Sheets

(56) References Cited

U.S. PATENT DOCUMENTS

| | | | |
|---|---|---|---|
| 2004/0066695 A1 | 4/2004 | Anand et al. | |
| 2006/0239088 A1 | 10/2006 | Anand et al. | |
| 2008/0065929 A1* | 3/2008 | Nadeau-Dostie | G11C 29/802 |
| | | | 714/E11.054 |
| 2012/0120733 A1 | 5/2012 | Son et al. | |
| 2013/0021861 A1* | 1/2013 | Shvydun | G11C 29/72 |
| | | | 365/200 |
| 2016/0172058 A1 | 6/2016 | Srivastava et al. | |
| 2018/0374556 A1 | 12/2018 | Varadarajan et al. | |
| 2019/0156908 A1 | 5/2019 | Varadarajan et al. | |
| 2020/0321071 A1 | 10/2020 | Varadarajan et al. | |

OTHER PUBLICATIONS

International Search Report for PCT/US2021/063654 mailed Mar. 17, 2022.

\* cited by examiner

BUILT-IN MEMORY REPAIR WITH REPAIR CODE COMPRESSION

CROSS-REFERENCE TO RELATED APPLICATIONS

This application is a continuation of U.S. patent application Ser. No. 17/125,323, filed Dec. 17, 2020, which is incorporated by reference herein in its entirety.

TECHNICAL FIELD

This disclosure relates to built-in memory repair supporting repair code compression.

BACKGROUND

Integrated circuits (ICs) generally include various modules combined to perform various functions. For example, a digital signal processor (DSP) includes processor and memory instances embedded in the IC. The memory instances containing plurality of addressable memory locations are tested for defects, ensuring the operability of the IC. To test these memory instances, special test circuits, referred to as "Built-In Self-Test" (BIST) circuits may be incorporated into the IC. BIST circuits generate a test pattern to determine whether one or more elements of the memory instance are defective or not. The BIST circuits further may implement built-in self-repair (BISR) methods to repair defective memory instances. A goal of the BIST and BISR is to improve the IC device yield at manufacture while minimizing IC overhead. Such goal is more difficult to achieve as device densities continue to increase and device sizes decrease.

SUMMARY

In a described example, an integrated circuit (IC) includes built-in self-repair (BISR) circuitry having an input adapted to be coupled to a memory system including one or more memory instances on the IC. The BISR circuitry includes input logic configured to convert memory fail signature data for a respective memory instance into a memory repair code data having a unified repair format. Compression logic is coupled to the input logic. The compression logic is configured to encode the memory repair code data in the unified repair format and provide compressed repair data at an output of the compression logic. A data register, having an input coupled to the output of the compression logic, is configured to store the compressed repair data.

In another described example, an integrated circuit includes a repairable memory system. A repair controller is coupled to the repairable memory system. The repair controller includes compression logic configured to encode memory repair code data for a respective instance of the repairable memory system and provide compressed repair data. A non-volatile memory controller is coupled to the repair controller and to non-volatile memory. The non-volatile memory controller is configured to transfer the compressed repair data to the non-volatile memory for storage.

In another described example, a method includes receiving, at an input of built-in self-repair (BISR) circuitry implemented on an integrated circuit (IC), fail signature data identifying one or more defective memory elements for a respective memory instance of repairable memory implemented on the IC. The method also includes converting the fail signature data for the respective memory instance into memory repair code data in a unified repair format. The method also includes compressing the memory repair code data in the unified repair format to provide compressed repair data, and transferring the compressed repair data to non-volatile memory on the IC.

DETAILED DESCRIPTION

This description provides an efficient built-in memory repair technique that implements compression to store repair codes for defective memory instances.

As an example, an integrated circuit (IC) includes a memory repair controller that is coupled to respective embedded memory instances of a memory system. For example, the memory repair controller includes a built-in self-repair (BISR) circuitry. The BISR circuitry is configured to generate memory repair code data (e.g., a repair signature) for the respective memory instances of the memory system. In an example, the BISR circuitry is configured to encode memory repair code data into compressed repair data for the respective memory instances, and the compressed repair data may be stored in a data register of the BISR circuitry. The compressed repair data for the respective memory instances may further be stored in non-volatile memory to enable later retrieval and repair of the respective memory instances, as described herein. The processes of repairing, encoding, compressing the memory repair codes may be repeated for each of the respective memory instances implemented on the IC.

As a further example, the IC includes the non-volatile memory and a non-volatile memory controller coupled to the non-volatile memory. For example, the non-volatile memory controller is configured to read the compressed repair data for a respective memory instance from the non-volatile memory. Logic is configured to decode the compressed repair data for the respective memory instance into a full (uncompressed) memory repair code data (e.g., a repair signature). The memory repair code data may be transferred to a respective memory instance for repairing a defective memory elements of the respective memory instance. The processes of reading, decompressing and transferring the repair data may be repeated for each of the respective memory instances. As used herein, compression and variations thereof refer to reducing the number of bits for a unit of data, such as may involve a type of encoding and/or compaction of the bits of data. Similarly, decompression is returning a compressed (or compacted) version of a unit of data back to its original format and number of bits, such as may involve decoding and/or decompaction.

The approach described herein thus employs efficient compression techniques that can both improve repair time as well as reduce memory requirements for a given memory system. Additionally, the compression and decompression may be lossless (e.g., no information is lost during compression and decompression). The centralized BISR further can support multiple levels and types of encoding and compression, which may be configurable for the IC. For example, the type of encoding and compression may be selected based on size and/or content of the respective memory instances.

Figure 1:
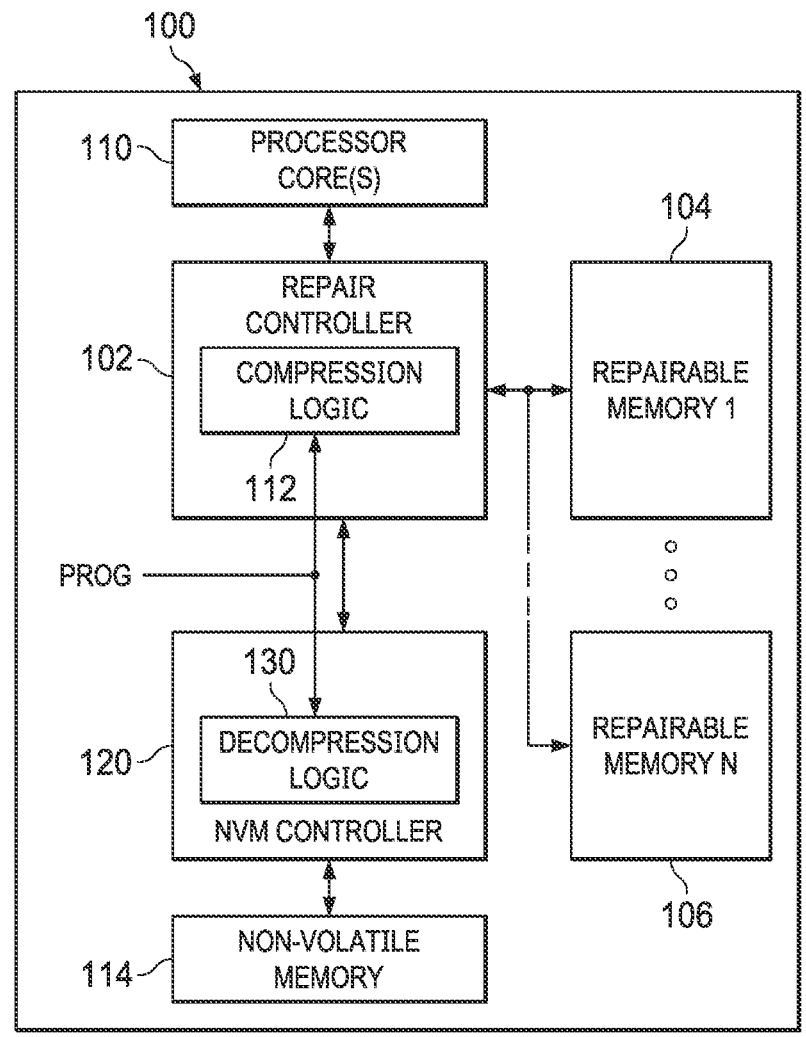
FIG. 1 is a block diagram of an example integrated circuit that includes a memory repair system with repair code compression.

FIG. 1 depicts an IC 100 implementing an example memory repair system. The memory repair system includes a memory repair controller 102 coupled to one or more instances of repairable memory 104 and 106, shown as respective memories 1 through N (N is a positive integer denoting the number of memory instances). For example, the respective memory instances 104 may be any form of storage implemented on the IC 100, including SRAM, DRAM, DDR memory, SDRAM, or the like. In an example, all the memory instances 104, 106 may be the same type of memory. In another example, memory instance 104 is implemented as one type of memory and memory instance 106 is implemented as a different type of memory (e.g., some blocks are SRAM memories and other blocks are DDR memories). As described herein, the repair controller 102 may store data (e.g., in a memory information table) specifying an identifier (ID) for each of the respective memory instances. In an example, the memory instance 104, 106 is implemented with a respective circuitry to enable communication between the repair controller 102 and the respective memory instances for testing and repair thereof in the memory.

In an example, the repair controller 102 includes circuitry is configured to perform self-repair of a respective memory instance 104, 106 responsive to determining (e.g., by test circuitry, which may be on the IC or external) one or more elements of the respective memory instance are defective. The repair controller 102 is configured to generate memory repair code data (e.g., a multi-bit repair code, such as a repair signature) for the respective memory instance 104, 106 based on fail signature data identifying the location of one or more failed memory elements (rows and/or columns) for the respective memory instance. For example, on activation (e.g., at power-up) of the integrated circuit 100, the repair controller 102 performs self-repair of the respective memory instances 104, 106.

As an example, an instance of repairable memory 104, 106 is configured to have one or more spare (e.g., redundant) memory elements (rows and/or columns) that are used to replace defective memory elements (rows and/or columns) of the memory instance. The identity of the defective memory elements that need to be replaced for a respective memory instance is identified (e.g., encoded) in the fail signature data for the respective memory instance. Memory repair code data is generated to repair the defective elements within the memory instance. For example, the memory repair code data enables the memory instance to replace the defective elements (identified by the fail signature code) with its corresponding spare memory elements, such as by remapping the address of the defective elements to the address of spare elements. The length (number of bits) of usable repair signature depends upon the actual number of repairable elements (rows and/or columns) in the given memory instance. Different memory instance configurations may have different numbers of repairable elements (rows and/or columns). Therefore, different respective memory instances 104, 106 may have different numbers of usable repair bits in the memory repair code data determined (e.g., by repair controller 102) for the respective memory instances.

As a further example, the repair controller 102 is implemented as centralized memory repair circuitry coupled to one or more processor cores 110 and the memory instance 104, 106. In an example, one or more of the memory instances 104, 106 are embedded memories of the processor core 110. The repair controller 102 can include input logic configured to reformat fail signature data from diverse memory instances 104, 106, each having its own unique data format and number of bits, into a unified repair format. The unified repair format is a common format that enables centralized processing and repair analysis of memory repair codes by logic of the repair controller 102.

For example, the unified format may be arranged according to a super-set of the repair cells over the associated memory instances (e.g. embedded memories of one or more processor cores 104, 106), such that the format is sufficient to encode a fail signature data pattern for the memory instance with the most complex repair architecture (i.e., largest number of repair cells, and longest corresponding repair signature). The input logic thus can pad additional bits (e.g., with "0") for those memories having less complex repair architectures (i.e., fewer repair entities, or shorter memory repair signatures) of the unified repair format. Because the fail signature data is converted to the unified format regardless of the architecture of the memory instances 104, 106 themselves, a common set of logic functions implemented by the repair controller 102 may be shared across multiple memory instances 104, 106 and across multiple processor cores 110. The input logic also analyzes and encodes the fail signature data into memory repair code data in the unified format for the respective memory instance. The memory repair code data identifies repair memory cells (e.g., spare rows and/or columns) in the respective memory instance available to be mapped into the memory address space in place of defective memory elements specified by corresponding fail signature data.

The repair controller 102 also includes compression logic 112 configured to compress (compress) the repair code data and provide compressed repair data. The compression logic 112 may be implemented as hardware (e.g., circuitry, a processor, field programmable gate array (FPGA) or combinations thereof), as software (e.g., instructions executable by one or more processor cores) or as a combination of hardware and software. In an example, the compression logic 112 implements a lossless form of compression on the repair code data (e.g., no information is lost during compression).

The compression logic 112 may be configured to implement one of several compression techniques for compressing the repair code data. As one example, the compression logic 112 includes a first compression logic instance configured to perform run length encoding to compress the repair code data to compressed repair data for a respective memory instance. As an additional, or an alternative example, the compression logic 112 includes a second compression logic instance that includes a look up table configured to encode the memory repair code data into compressed repair data for a respective memory instance. The compression logic 112 may include other instances of compression logic on the IC 100 to implement respective compression techniques (e.g., key-value pair encoding, Huffman coding, etc.), which may be in addition to or as an alternative to those described above.

In an example where the compression logic 112 includes multiple instances of compression logic on the IC 100, the repair controller 102 is configured to control which one or more of the available compression techniques the compression logic 112 is enabled (or disabled). For example, the compression logic 112 has a control input to receive a program (PROG) input signal (e.g., one or more values stored in a register). In an example, the repair controller 102 and NVM controller 120 may disable compression logic 112 responsive to the PROG input signal. In an additional or alternative example, the repair controller 102 and NVM controller 120 may set which compression technique(s) to enable, respectively, for compressing repair code data for the respective memory instance 104, 106. The PROG input may be set to a fixed value for the IC 100 or the PROG input may be configurable during operation of the IC 100 (e.g., by setting a corresponding register entry that provides the PROG input signal).

In an example, the repair controller 102 controls the compression logic 112 to implement a selected one of the compression techniques globally for all memory instances 104, 106. In another example, the repair controller 102 controls the compression logic 112 to implement a given compression technique independently for each respective memory instance 104, 106, such as on a per-memory basis. The compression logic 112 further may be configured based on the type or content of the respective memory instance 104, 106 that is being repaired.

As described herein, the repair controller 102 is configured to store compressed repair data for a respective memory instance 104, 106 in non-volatile memory (NVM) 114. The non-volatile memory 114 may include one or more electrical FuseROM, one-time programmable ROM (OTP ROM), electrically programmable ROM (EPROM), or electrically erasable programmable ROM (EEPROM). "Hard" memory repair techniques use such non-volatile memory to store memory repair information to enable repair of defective cells. Because the repair data is compressed (e.g., having fewer bits that the original memory repair code), the size of the non-volatile memory 114 may be reduced, which further enables overall area reduction for the IC 100.

As shown in the example of FIG. 1, the repair controller 102 is coupled to a non-volatile memory (NVM) controller 120, which is coupled to the non-volatile memory 114. For example, after generating the compressed repair data for a defective memory instance 104, 106, which may be stored temporarily in a register for the respective memory instance, the repair controller 102 causes the NVM controller 120 to transfer the compressed repair data from the register to the non-volatile memory 114 for storage. In another example, the repair controller 102 may be coupled to the non-volatile memory 114 and be configured to transfer the compressed repair data from the register directly to the non-volatile memory 114 for storage.

In the example of FIG. 1, the NVM controller 120 includes decompression logic 130. The decompression logic 130 is configured to decompress (decode) the compressed repair data that is retrieved from the non-volatile memory 114 into a full (uncompressed) memory repair code data. For example, the decompression logic 130 is configured to perform an inverse of the compression technique implemented by the compression logic 112, namely, to decompress the compressed repair data. Thus, the decompression logic 130 may be configured to implement one of several decompression techniques for decompressing the repair code data. As one example, the decompression logic 130 includes an instance of decompression logic configured to decompress run length encoded data. As an additional, or an alternative example, the decompression logic 130 includes another instance of decompression logic that includes a look up table configured to convert the compressed repair data to original memory repair. The decompression logic 130 include other instances of decompression logic to implement other types of decompression techniques (e.g., key-value pair decoding, Huffman decoding, etc.), which may be in addition to or as an alternative to those described above.

As a further example, at start up (e.g., a power on reset), the NVM controller 120 is activated to read compressed repair data from the non-volatile memory 114. The decompression logic 130 employs respective decompression logic to decompress the compressed repair data for a respective memory instance 104, 106. In an example, the decompression logic 130 has a control input to receive the PROG input signal. As described, the PROG input signal may remain the same for each of respective memory instances 104, 106. In another example, the PROG input signal may vary to select different decompression logic for respective memory instances 104, 106. The decompression logic 130 thus is configured to set which decompression logic to implement responsive to the PROG input signal for decompressing the compressed repair data. The NVM controller 120 is further configured to transfer the decompressed, original repair code data to a repair entity of the memory instance 104, 106 for repairing one or more defective memory elements of the respective memory instance according to the repair cells that are allocated for repair of such memory instance.

For example, each memory instance 104, 106 may be include one or more repair cells, such as one or more spare rows, one or more spare columns, or some combination of spare rows and columns. These spare memory cells may not be involved in the storing of data if all of the main memory cells are properly functioning. However, the spare memory cells are available to be mapped into respective memory address space in place of failed cells in the main memory array. The memory repair code data thus includes a repair pattern to invoke allocation of repair cells based on the defective memory cells determined (by one or more test functions) for each of respective memory instances 104, 106. The process may be repeated for each of the memory instances 104, 106 based on the compressed repair data stored in the non-volatile memory 114.

In one example, the memory instance 104, 106 includes caches implemented in a microprocessor or other arrays implemented in the microprocessor (e.g. translation lookaside buffers etc.). In an alternative example, the IC 100 includes one or more processors and supporting circuitry (e.g., repair controller 102 and the NVM controller 120) in an integrated processor configuration (e.g. a microcontroller or embedded processor). In such an implementation, the memory instance 104, 106 includes caches or other memories for the processor as well as memories for the supporting circuitry. In another example, one or more processors and one or more peripheral circuits (e.g. I/O interface circuits or integrated I/O peripherals) are included in a system on chip (SoC) configuration. The memory instance 104, 106 would then include caches or other memories for the processor as well as memories for the peripheral circuits. In other examples, the IC 100 includes no processors and is a fixed-function integrated circuit, such as an application specific integrated circuit (ASIC) or field programmable gate array (FPGA) that includes the memory instances 104, 106.

Figure 2:
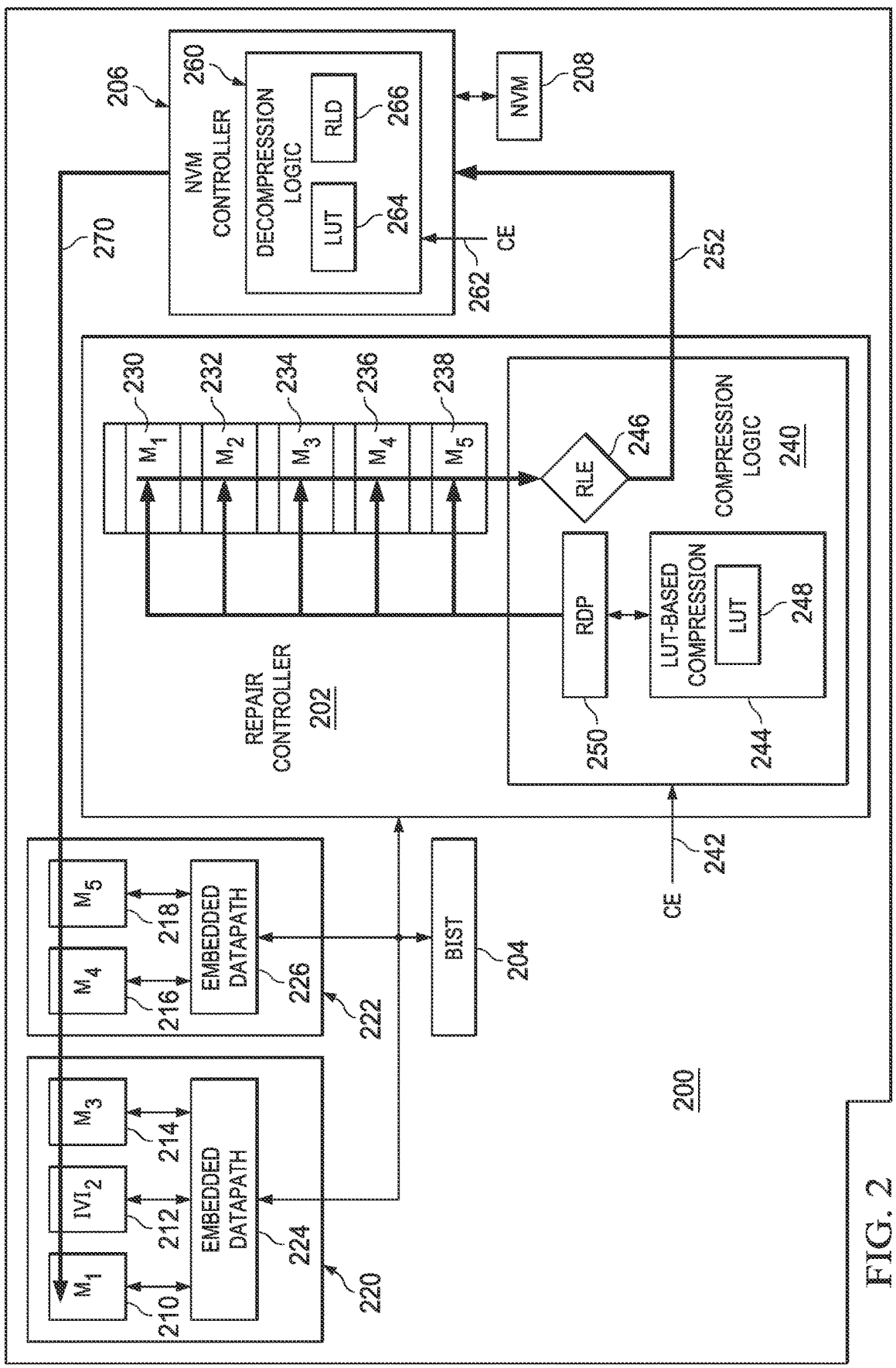
FIG. 2 is a block diagram of another example memory repair system implementing repair code compression and decompression.

FIG. 2 depicts an example of an IC 200. The IC 200 implements a memory repair system that includes a repair controller 202, built-in self-test (GIST) circuitry 204, an NVM controller 206 and non-volatile memory 208. The repair controller 202 provides an example of the repair controller 102 of FIG. 1. The IC 200 shows a useful example of the IC 100 of FIG. 1, such as may be implemented as an SoC. The IC 200 may include additional or alternative components and functions from that shown in FIG. 2, or may have its functions arranged differently from that shown in FIG. 2.

In the example of FIG. 2, the memory instances 210, 212, 214 are shown as embedded memory resources implemented on a processor core 220, and memory instances 216 and 218 are shown as embedded memory resources implemented on another processor core 222. As an example, memory resources 210, 212, 214, 216 and 218 are implemented as random access memory (RAM) for data storage (e.g., static RAM (SRAM), dynamic RAM (DRAM) or the like) as well as other types of volatile memory or non-volatile memory (e.g., flash, electrically programmable read-only memory (ROM)) for storage of data or program instructions, or a combination of these memory types.

The processor cores 220 and 222 include respective embedded datapaths 224 and 226. The repair controller 202 and the BIST circuitry 204 are coupled to memory resources 210, 212, 214, 216 and 218 through the datapaths 224 and 226. For example, each of the processor cores 220, 222 constitutes a block of programmable or custom logic circuitry in combination with embedded memory resources. The processor cores may be implemented as "soft" cores in the form of synthesizable data according to a hardware description language or gate-level "netlist" or as "hard" cores in the form of low-level physical description or actual integrated circuit layout. Processor cores 220, 222 are also referred to as "intellectual property cores", "IP cores", or more simply "IPs", and are often distributed under license agreements with the owner of the intellectual property rights in the design. Thus, processor cores 220, 222 in the IC 200 need not originate from the same source or vendor. In an example, the processor cores 220 and 222 may be provided from different vendors and include different functional and BIST architectures, which may reside within the same IC 200.

The datapaths 224, 226 may include physical interfaces (e.g., a common bus structure) over which processor cores 220, 222 respectively, may export BIST data to BIST circuitry 204 or other test circuitry. For example, the repair controller 202 also may receive data over the datapaths 224, 226, such as resulting from the execution of self-test program routines implemented by processor cores 220, 222, such as at power-up of the IC 200. As described herein, the memory instances 210, 212, 214, 216 and 218 may also be testable by the BIST circuitry 204. For example, the at power-up of IC 200, BIST circuitry 204 is configured to initiate and evaluate self-test routines for circuitry outside of those functions that include their own embedded BIST function (e.g., other than processor cores 220, 222). For example, the repair controller 202 receives memory fail signature data to identify bit locations, if any, that failed the BIST routines executed by BIST circuitry 204 or test algorithms applied to the respective memory by external automated test equipment.

As an example, the repair controller 202 includes BISR circuitry configured to implement a unified architecture to repair diverse memory instances 210, 212, 214, 216 and 218. As described herein, the unified architecture is enabled by the aligning and merging fail signature data from diverse memory architectures into an interface that is applied to the unified repair architecture. The unified architecture can reduce the time to repair the memory instances 210, 212, 214, 216, 218. Repair analysis, as performed under the unified repair architecture on the aligned and merged repair code data, results in memory repair code data that are reconfigured and encoded for storing in shadow registers for each of the respective memory instances 210, 212, 214, 216 and 218.

As shown in FIG. 2, the repair controller 202 has inputs coupled to the datapaths 224, 226 through input interfaces. In an example, the repair controller 202 includes BISR circuitry that implements a unified repair architecture for performing repair analysis for the embedded memory instances 210, 212, 214, 216 and 218. The repair controller 202 is configured (e.g., by input logic) to convert fail signature data received from a respective memory instance 210, 212, 214, 216 and 218 through a respective embedded datapath 224, 226 into a unified repair format of data that is appropriate for repair analysis. The repair controller 202 is further configured (e.g., by input logic) to reconfigure and encode the data into repair code data applicable to each of the diverse memory instances 210, 212, 214, 216 and 218.

A "self-repair" may be implemented by retaining the resulting repair code data for each memory instance 210, 212, 214, 216, 218 in respective registers 230, 232, 234, 236 and 238, such as banks of flip-flops or other forms of memory. The registers 230, 232, 234, 236 and 238 are referred to herein as "shadow registers" because the registers temporarily store memory repair code data that represent repair code data that is to be stored in the non-volatile memory 208 (in a compressed format). In an example, each of the registers 230, 232, 234, 236 and 238 is implemented in the repair controller 202 for a respective memory instances 210, 212, 214, 216 and 218 in the IC 200. In an example, each of the shadow registers 230, 232, 234, 236 and 238 are variable length memories having a number of bits based on the type and/or configuration of the respective memory instance. Additionally, or alternatively, the length of each shadow register 230, 232, 234, 236 and 238 may be set based on a value provided by the LUT 248 when LUT-based compression is being implemented.

As described herein, the repair controller 202 includes compression logic 240 configured to compress (e.g., encode) the memory repair code data (provided by input logic in the unified repair format) and provide compressed repair data having a smaller number of bits than the original memory repair code data. The compression logic 240 may be implemented by the compression logic 112, as described with respect to FIG. 1. In one example, the compression logic 240 is configured to retrieve memory repair code data that is stored in one of the shadow registers 230, 232, 234, 236 and 238 and compress the retrieved repair code data. In another example, the compression logic 240 is configured to compress the memory repair code data (e.g., provided by input logic or other circuitry) and store the compressed repair data in a respective shadow registers 230, 232, 234, 236 and 238 that is linked to respective memory instance for which the repair code data had been generated.

The compression logic 240 may be configured to implement one of several compression techniques for compressing the repair code data or compression may be disabled. For example, the compression logic 240 includes a control input 242 configured to receive compression enable (CE) data. The CE data can include a value (e.g., stored in a register) to indicate whether or not compression is enabled and, if enabled, which one or more types of compression is enabled. In the example of FIG. 2, the compression logic 240 includes a look-up table (LUT) based compression logic 244 and run length encoding (RLE) compression logic 246. Thus, one or more forms of compression logic 244, 246 may be enabled. In the example of FIG. 2, the LUT-based compression logic 244 is coupled between the embedded datapaths 224, 226 and shadow registers 230, 232, 234, 236 and 238, and RLE compression logic 246 is coupled between the registers and an output of the repair controller 202. The LUT-based compression logic 244 may be coupled to the shadow registers 230, 232, 234, 236 and 238 through a repair datapath (RDP) 250.

As a further example, the LUT compression logic 244 is configured to assign memory repair codes to respective bins based on an actual number of usable repair signature bits in the original (uncompressed) memory repair code for respective memory instances. As described, different types and configurations of memory instances may have different numbers of usable repair signature bits. The number of actual usable repair signature bits in each memory repair code is known for each memory instance 210, 212, 214, 216, 218. To enable testing and repair, each memory instance stores a memory repair code data in a repair register having a number of bits that is equal to or greater than the actual usable repair bits for the respective memory instance. Accordingly, LUT compression logic 244 can assign memory repair code data for each memory instance 210, 212, 214, 216, 218 to a respective bin based on a memory identifier (ID) representing the respective memory instance currently under test by repair controller 202.

The LUT compression logic 244 is further configured to map each bin to a unique value of compression control data. For example, the logic 244 includes a look-up table (LUT) 248 indexed by the bin. Thus, the LUT 248 includes compression control data that is mapped to each respective bin. The LUT 248 is thus configured to output a value of compression control data (e.g., a number of one or more bits) based on the bin to which the respective memory repair code is assigned. For example, the compression control data may be implemented a prefix, a postfix or a set of bits distributed at known locations in the compressed repair data. In an example, the number of bits used for compression control data for the respective bins may vary up to a maximum number of bits. The logic 244 adds (e.g., appends or otherwise links) a value of compression control data to compressed (or compacted) repair codes to provide the compressed repair data that is provided to the registers 230, 232, 234, 236 and 238 through the repair datapath 250. The value used for compression control data enables subsequent decompression of the compressed repair data (e.g., by decompression logic 260).

In the example of FIG. 2, the repair controller 202 is configured to provide the compressed repair data to the NVM controller 206 through a datapath 252 implemented on the IC 200. The on-chip datapath 252 between the repair controller 202 and the NVM controller 206 shows an example where the IC 200 supports both compression and decompression. In another example, such as where the NVM controller 206 is not implemented on the IC 200 (e.g., NVM controller is external circuitry), the repair controller 202 may be coupled to an output terminal of the IC 200, such as to provide the compressed repair data to external circuitry (e.g., an external memory controller) for storage. In another example, the compression logic 240 may be omitted from the IC (e.g., the repair controller 202 does not support on-chip compression) and an input terminal of the IC 200 may be coupled to an external source adapted to provide compressed repair data to the NVM controller for storage in the NVM 208. Thus, the IC 200 may implement on-chip compression, on-chip decompression or both on-chip compression and on-chip decompression.

In the example of FIG. 2, the NVM controller 206 is configured to transfer the compressed repair data (received via datapath 252 or an external input) into the non-volatile memory 208 for storage. In an alternative example, the repair controller 202 may be coupled to the non-volatile memory 208 (e.g., through another bidirectional datapath—not shown) and thus be configured to transfer the compressed repair data directly to the non-volatile memory 208 (without going through the NVM controller 206). This demonstrates a case where the IC has a built-in repair controller that supports both decompression and compression. Because the repair codes have been compressed, the amount of memory needed to store repair codes for the memory instances 210, 212, 214, 216, 218 may be reduced compared to systems that do not implement compression.

As a further example, the NVM controller 206 includes decompression logic 260 configured to decompress (e.g., decode) compressed repair data. The decompression logic includes logic (e.g., hardware and/or software) configured to decompress the compressed repair data according to any form of compression that may be implemented by the compression logic 240 (or by off-chip compression circuitry). As with the compression logic 240, the decompression logic 260 may be configured to implement any number and types of different instances of decompression logic according to compression implemented by the compression logic 240 to compress repair data for storage in the non-volatile memory 208.

In the example of FIG. 2, the decompression logic 260 includes LUT-based decompression logic 264 and run-length decoding (RLD) logic 266. For example, the LUT-based decompression logic 264 includes a LUT configured to restore the original repair code based on the compression control data (e.g., added as prefix or other code by compression logic 244). In an example, the decompression logic 264 extracts the compression control data from the compressed repair data and applies the compression control data as an index to the LUT. The LUT returns a result that identifies a number of bits that are to be added to the repair code to restore it to the original memory repair code. As a further example, the RLD logic 266 is configured to decompress run-length encoded data produced by the RLE logic 246 by returning bits of the memory repair code from an RLE-bits back to the original number and sequence of bits.

The NVM controller 206 is further configured to transfer the decompressed (original) memory repair code to the respective memory instance 210, 212, 214, 216, 218 for use in repairing defective memory elements of the respective memory instance for which the memory repair code had been generated. The NVM controller 206 may transfer the repair code to the respective memory through a repair datapath, shown as 270. The NVM controller 206 may be coupled to the memory instances 210, 212, 214, 216, 218 so that repair datapath 270 does not pass through repair controller 202. In an example, the non-volatile memory 208 is a Fuse Rom memory structure (e.g., electrically programmable fuses). In other examples, different types of non-volatile memory may be used to implement memory 208, such as described herein. The NVM controller 206 may repeat the process of decompressing compressed repair data and transferring memory repair codes for each of the memory instances 210, 212, 214, 216, 218.

Figure 3:
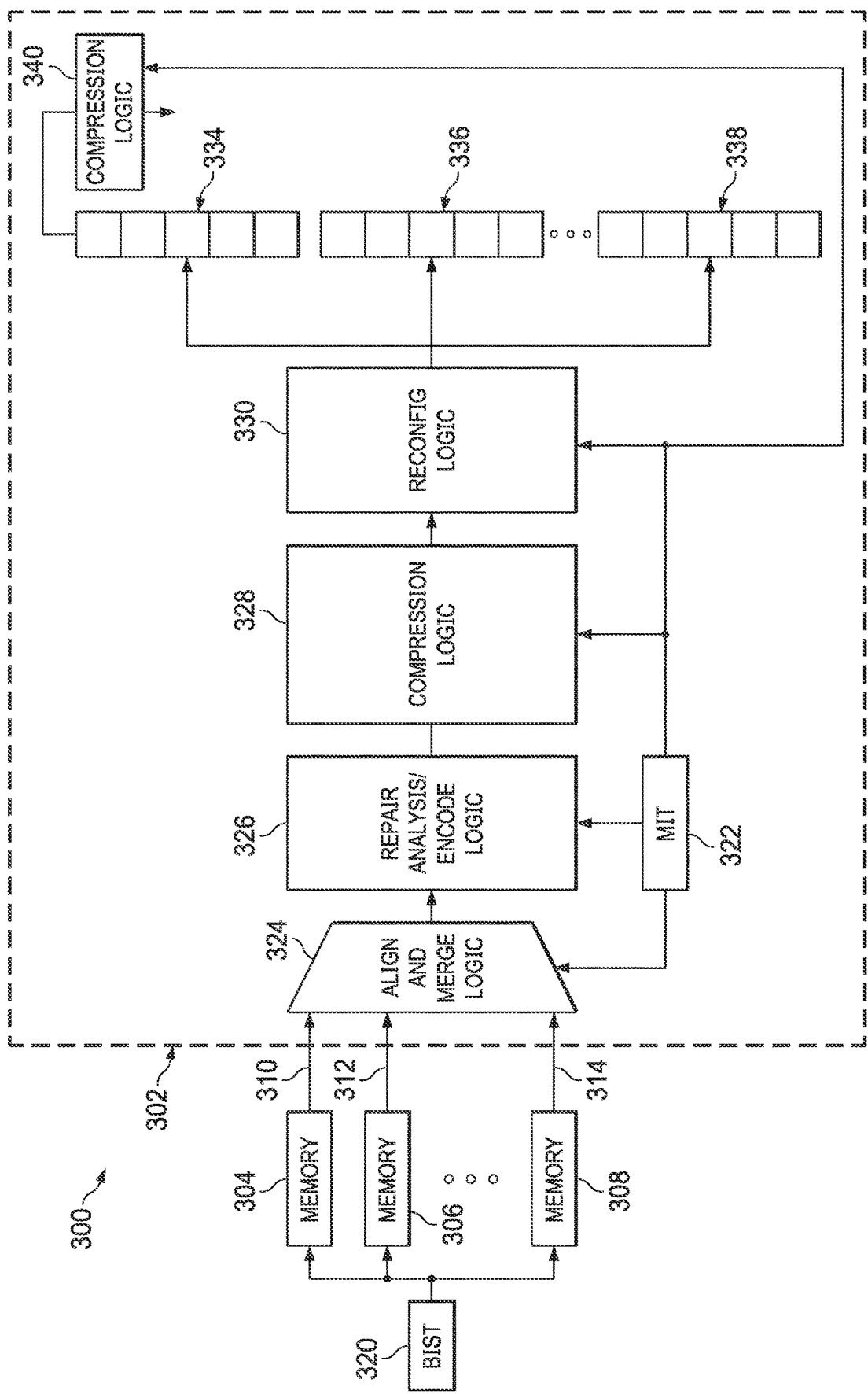
FIG. 3 depicts an example of a built-in self-repair architecture.

FIG. 3 is a block diagram of an example of a built-in self-repair architecture 300 showing functional blocks that may be implemented by BISR circuitry 302, such as by repair controller 102 or 202. The BISR circuitry 302 is coupled to memory instances 304, 306 and 308. As described herein, the respective memory instances 304, 306 and 308 may include one or more repairable memory structures implemented as volatile or non-volatile memory. For example, the BISR 302 includes inputs 310, 312 and 314 coupled to embedded datapaths (e.g., buses) of processor cores that contain the respective memory instances 304, 306 and 308. BIST circuitry 320 is also coupled to the memories through respective datapath. The BIST circuitry 320 is configured to initiate and evaluate self-test routines applied to test each respective memory instance 304, 306, 308. The BIST circuitry 320 generates a fail signature data to identify the location (e.g., memory address) of defective memory elements a respective memory instance 304, 306, 308. For example, as described herein, the BISR circuitry 302 receives fail signature data (e.g., a signature identifying location of any defective memory elements) for a respective memory instance responsive to the test routines executed by BIST circuitry 320. The BISR circuitry 302 may be configured to efficiently understand differences in physical, logical, and repair architectures among the memory instances 304, 306 and 308, regardless of the numbers or types of memory instances.

In an example, a memory information table (MIT) 322 is configured to store a memory ID (e.g., a value) representative of which memory instance 304, 306, 308 is actively under test by the BIST circuitry 320 or other test system (e.g., test circuitry on the IC or external to the IC). The MIT 322 thus can provide the memory ID to the BISR circuitry 302 to indicate for which memory instance 304, 306, 308 the fail signature data has been generated and is currently under test. In another example, the MIT 322 stores compression enable data (CE), such as described herein to indicate whether compression is enabled or disabled, and, if enabled, a type compression to be implemented (by compression logic 328, 340).

The BISR circuitry 302 includes align and merge logic 324, repair analysis and encode logic 326, compression logic 328 and 340 and reconfigure logic 330. The align and merge logic 324 and encode logic 326 provide a useful example of the input logic configured to provide memory repair code data in a unified format, as described above. For example, the align and merge logic 324 receives fail signature data at the inputs 310, 312, 314 from the embedded datapaths for the memory instances 304, 306, 308 under test. The align and merge logic 324 also may receive the memory ID data from the MIT 322. Alternatively, the memory ID may be provided as part of the fail signature data. The align and merge logic 324 includes functional circuitry that is configured to align and merge the received fail signature data into a unified repair format based on the memory ID of the respective memory instance under repair. For example, the unified repair format is arranged according to a super-set of the repair registers over the associated embedded memory instances 304, 306 and 308, such that the format is sufficient to encode a repair pattern for the memory with the most complex repair architecture (i.e., largest number of repair entities, and longest corresponding signature). The align and merge logic 324 thus pre-processes fail signature data from diverse memory architectures into a unified data format provided at an output of the logic 324 for the respective memory instance under test.

The repair analysis and encode logic 326 has an input coupled to the output of the align and merge logic 324, as well as is coupled to the MIT 322 to receive the memory ID data. The repair analysis and encode logic 326 thus receives the fail signature data in the unified format for the respective memory instance 304, 306, 308 under test from align and merge logic 324. Because the memory repair code data is provided (e.g., by align and merge logic 324) in a unified repair format, regardless of the architecture of the memories themselves, the repair analysis and encode logic 326 can be shared across multiple diverse memory instances and across multiple processor cores.

As an example, the repair analysis and encode logic 326 is configured (e.g., implementing a memory redundancy analysis algorithm) to allocate repair cells (spare rows and/or columns) to be invoked for each repairable memory instance 304, 306, 308 based on the aligned and merged fail signature data for the respective memory instance. The repair analysis and encode logic 326 may determine whether redundancy repair is necessary for a respective memory instance and, if so, the allocation of repair resources to best address the failed bits. The repair analysis and encode logic 326 also includes circuitry configured to encode the fail signature data (in the unified format) for a respective memory instance 304, 306, 308 into an encoded pattern of memory repair code data. The encoded pattern of memory repair code data enables respective memory instance 304, 306, 308 to invoke respective repair cells (e.g., one or more spare rows and/or columns) to replace defective memory elements identified in the fail signature data. The encoded pattern of memory repair code data may be provided in the unified format with a maximum number of bits permissible for each respective memory instance 304, 306, 308.

The compression logic 328 has an input coupled to the output of the repair analysis and encode logic 326 to receive the encoded pattern of repair data, which is provided in the unified repair format. The compression logic also is coupled to the MIT 322. The compression logic 328 may be implemented by the compression logic 112 or 240 described herein. The compression logic 328 thus includes circuitry configured to implement one or more types of compression (e.g., LUT-based compression, prefix coding, etc.), which may be selectively enabled or disabled responsive to CE data (e.g., provided by MIT 322). The compression logic 328 is configured to compress the encoded pattern of memory repair code data received from the repair analysis and encode logic 326 and provide respective compressed repair data at an output of the compression logic 328.

In an example, the compression logic 328 may implement the same type of compression for compressing repair data for each of the respective memory instances 304, 306, 308. In another example, the compression logic 328 may selectively apply a given type of compression (or no compression) for compressing repair data depending on which respective memory is currently under test. For example, the compression logic 328 may enable a given type of compression, on a per memory basis responsive to the memory ID (stored in the MIT 322), for compressing memory repair code data depending on the respective memory currently under test.

The reconfiguration logic 330 has an input coupled to the output of the compression logic 328, as well as may be coupled to the MIT 322. The reconfiguration logic 330 includes circuitry configured to reconfigure the bits of compressed repair data (derived by logic 326 and compressed by logic 328) into a proper format for storage in shadow registers 334, 336, 338. In an example, the reconfiguration logic 330 modifies the compressed repair data from the compression logic into the unified repair format. For example, the unified format of the compressed repair data may be provided with a maximum number of bits permissible for each respective memory instance 304, 306, 308 to enable further processing in the centralized BISR architecture. In another example, the reconfiguration logic 330 is configured to modify the pattern of bits in the compressed repair into an arrangement (e.g., number of bits and/or pattern) applicable to the respective memory instance to which the memory repair code data pertains based on the memory ID (provided in the MIT 322).

In an example, the reconfiguration logic 330 is coupled to the MIT 322, which stores the memory ID of the memory under test. The reconfiguration logic 330 thus can use the memory ID to route the compressed repair data to the appropriate register 334, 336, 338. In another example, the memory ID may be provided to control one or more switches or other circuitry (not shown) may be coupled between the logic 330 and the respective registers 334, 336, 338 to shift the compressed repair data from the reconfiguration logic 330 into the appropriate register. Each shadow register 334, 336, 338 may be configured to store memory repair code data for a respective one of the memory instances 304, 306, 308 in the unified format.

As a further example, the compression logic 340 may be used to compress the outputs of corresponding shadow registers 334, 336, 338. Similar to compression logic 328, compression logic 340 also includes circuitry configured to implement one or more types of compression (e.g., RLE encoding, Huffman encoding, etc.), which may be selectively enabled or disabled, such as responsive to CE data (stored in MIT 322 or another register). In one example, only compression logic 328 may be used for compression. In another example, only compression logic 340 may be used for compression. In a different example, both compression logic 328 and 340 may be used in combination. While the example of FIG. 3 describes compression logic 328 and 340 as including circuitry for performing a given form of compression, in another example, one or both instances of compression logic 328 and 340 may be configured to implement multiple encoding types. One or more instances of compression logic 328 and/or 340 thus may be placed either before or after the shadow registers 334, 336, 338, which may be may be implemented depending on various factors (e.g., depending on area savings, performance requirements, etc.).

After the compressed repair data (e.g., signature data) is stored in the register 334, 336, 338, the compressed data may be transferred to non-volatile memory for storage and implementing "hard" memory repair. In another example, the memory repair code data of registers 334, 336, 338 can be transferred to the respective embedded memory instances 304, 306, 308 (e.g., written to memory cells that store the row or column addresses to be replaced) or other non-volatile to accomplish "soft" repair.

Figure 4:
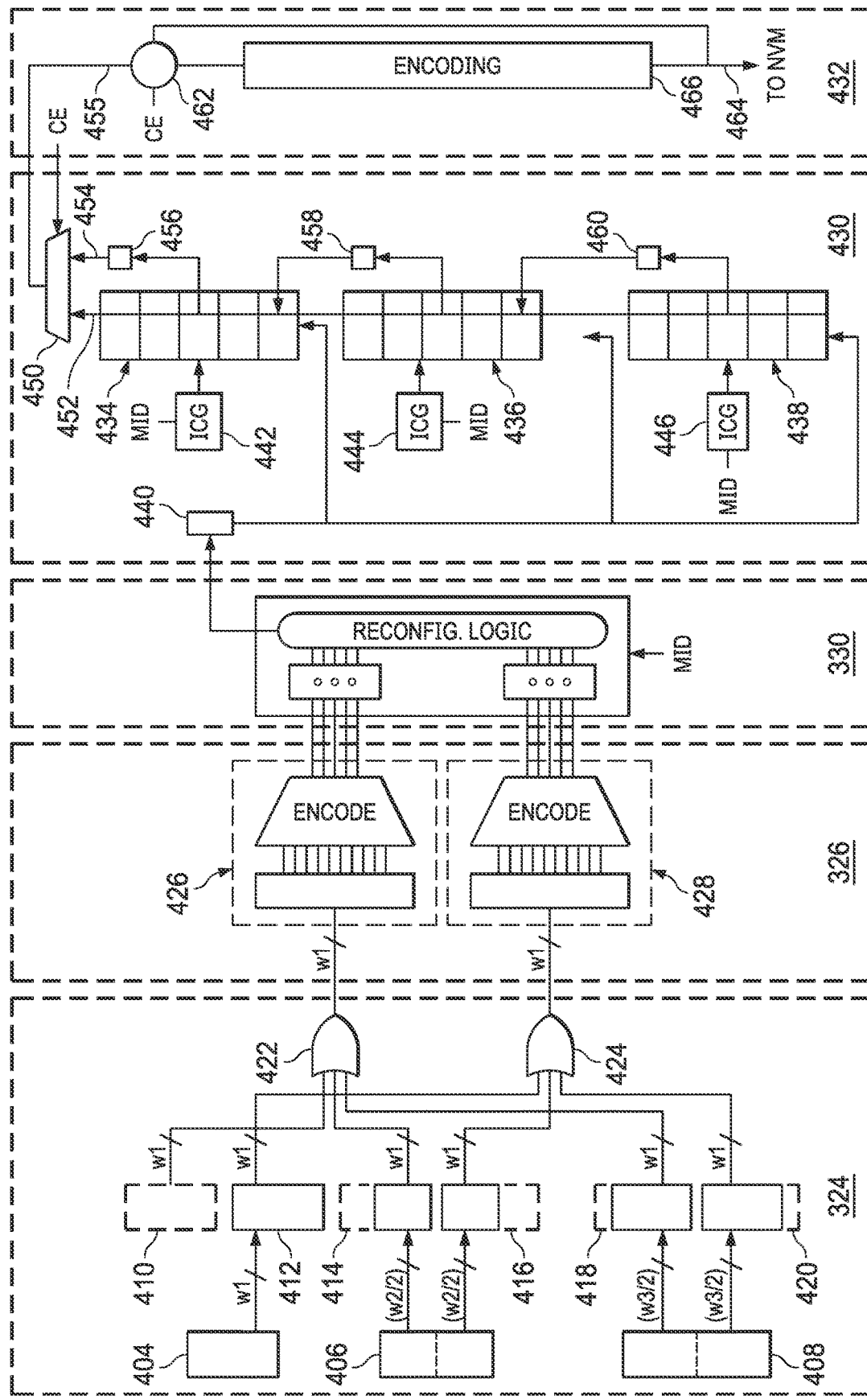
FIG. 4 depicts another example of a built-in self-repair architecture showing an example of centralized logic.

FIG. 4 depicts the built-in self-repair circuitry 302 showing an example of centralized logic that may be implemented by various logic blocks shown in FIG. 3. In particular, the BISR circuitry 302 includes align and merge logic 324, repair analysis and encode logic 326, compression logic 328, 340 and reconfigure logic 330. Accordingly, the following description of FIG. 4 also refers to FIG. 3.

In the example of FIG. 4, the alignment and merge logic 324 includes alignment functions 404, 406 and 408 for respective memory instances (e.g., embedded memory instances 304, 306 and 308). The alignment functions 404, 406 and 408 receive signature fail data produced by one or more test functions, such as BIST 320 described herein. As described herein, due to the diversity of memory instances 304, 306, 308, the signature fail data from each memory may be in a different format and bit length. Thus, the align and merge logic 324 is configured to transform the fail signature data into a unified repair format.

For example, the alignment functions 404, 406 and 408 include logic configured to split the fail signature data for respective memories into data portions that are stored in respective register stages 410, 412, 414, 416, 418 and 420. In the example of FIG. 4, memory instance 304 has only one repair memory cell and each of memory instances 306 and 308 has two memory cells of different sizes. Accordingly, alignment function 404 does not "split" the signature fail data. Instead, alignment function applies the signature fail data to register stage 412 and pads any excess bit positions of register stage 412 and the entirety of register stage 410 with "0's". The alignment function 406 splits the signature fail data for its associated memory 306 into two portions at a repair boundary (e.g., a midpoint of the memory repair code data), and applies one portion to register stage 414 for one of the repair cells and the other portion to register stage 416 for the other repair cell. The alignment function 406 may fill any excess bit positions of register stages 414 and 416 with "0's" data. The signature fail data for memory 308 may also center-decoded, such that alignment function 408 applies respective portions of the signature fail data to register stages 418 and 420, padding any excess bit positions with "0's" data.

The align and merge function 324 also includes logic, demonstrated as OR functions 422 and 424 having inputs coupled to the respective register stages 410, 412, 414, 416, 418 and 420. For example, the OR function 422 is configured to receive data from register stages 412, 414 and 418. The other OR function 424 is configured to receive data from register stages 410, 416 and 420. The OR functions have respective outputs coupled to inputs of the repair analysis and encode logic 326. The OR functions 422 and 424 are configured to merge the aligned signature fail data and provide aligned and merged signature fail data to respective encoders 426 and 428.

There can be one or more encoders 426 and 428, which can be used for any one of the memories. The number of encoders 426 and 428 corresponds to the maximum number of repair cells for an embedded memory in a respective processor core. For example, in the example of FIG. 4, the maximum number of repair cells among embedded memory instances 304, 306, 308 is two. Other numbers of encoders could be used in other examples, such as depending on the number of repair cells in the memory instances 304, 306, 308. Each encoder 426, 428 includes logic circuitry configured to encode signature fail data for a respective memory (e.g., memory 304, 306, 308) into memory repair code data (e.g., a repair signature pattern of bits) for the respective memory. For example, if the two cells for the memory instance are redundant columns, the signature fail data will indicate the column address in which a failure occurs, and thus the column address for which a redundant column is to be included in the function of the memory. However, because the signature fail data presented to encoders 426, 428 are arranged in a unified repair format, each of the encoders 426, 428 may be capable of encoding the repair pattern for each of the respective memory instances, regardless of the particular architectures of those memories. In an example, one or both encoders 426 and 428 further may include some or all of compression logic 328 (e.g., implementing LUT-based encoding logic 244) configured to compress the memory repair code data to provide corresponding compressed repair data, as described herein.

In the example of FIG. 4, encoders 426, 428 have outputs coupled to reconfiguration logic 330. Thus, one or the encoders 426, 428 provides the encoded memory repair patterns for the corresponding repair cells to reconfiguration logic 330. For example, the reconfiguration logic 330 includes a series of latches and multiplexers (not shown) coupled to respective encoders 426, 428. The multiplexers selectively route data stored in those latches according to a memory identifier (MID) having a value identifying the memory currently under test (e.g., provided by the MIT 322). The reconfiguration logic 330 is configured to reconfigure the repair patterns for a respective memory instance from the compressed repair format into the unified repair format, as described herein.

In the example of FIG. 4, repair controller also includes control and encoding logic 430 and compression logic 432. The control and encoding logic 430 includes registers (e.g., shadow registers) 434, 436, 438 assigned to respective memory instances 303, 304, 306. Each of the registers 434, 436, 438 is configured to store a number of bits of memory repair code data from the reconfiguration logic 330. For example, the memory repair code data is read out of the reconfiguration logic through a buffer or other memory 440. As described above for FIG. 3, the repair data stored in the registers may be compressed repair data or uncompressed repair data. The memory 440 is coupled to each of the registers 434, 436, 438, and configured to shift the memory repair code data into a respective one of the registers 434, 436, 438 according to the memory currently under test. For example, the control and encoding logic 430 includes logic integrated clock gating circuitry (ICG) 442, 444, 446 that is configured control shifting data into and out of the respective registers 434, 436, 438, such as according to the memory ID (MID) that identifies the memory currently under test. For example, ICG circuitry 442, 444, 446 shifts a number of bits from the reconfiguration logic 330 through memory 440 into a respective shadow register 434, 436, 438 equal to the number of bits used for the respective memory under test. The number of bits being shifted into respective registers 434, 436, 438 may also vary depending on the type of compression being implemented (e.g., by compression logic implemented in 326 or 330).

In an example, the control and encoding logic 430 is configured to control shifting memory repair code data out of registers 434, 436, 438 depending on the type (or types) of compression being implemented. For example, a compression enable signal (CE) has a value indicating whether compression is enabled or disabled. In examples where the compression logic 328 and 340 are configured to implement more than one type of compression (e.g., LUT-based encoding, RLE, Huffman encoding, etc.), the CE signal may also specify which type compression is to be performed. As described herein, the type of compression may be the same for all memory instances 404, 406, 408 being repaired. Alternatively, the type of compression may be separately programmable for each respective memory instance 404, 406, 408 (e.g., set to a selected type of compression based on the MID). In another example, the compression logic implemented in the IC may be disabled for one or more memory instances 404, 406, 408 so that a full length memory repair code is provided (e.g., bypassing all instances of compression logic).

As an example, the control and encoding logic 430 includes logic (e.g., a multiplexer) 450 having inputs coupled to respective datapaths 452 and 454 of the registers 434, 436, 438. For example, one datapath 452 of logic 450 is used to shift memory repair code data from the register 434, 436, 438 directly to an output 455 of the logic block 450 responsive to the CE signal indicating compression is disabled. The other datapath 454 employs additional logic 456, 458, 460 coupled to the respective registers. The other logic 456, 458 and 460 may be configured to read a compressed version of memory repair code data out of respective registers 434, 436, 438 responsive to the CE signal indicating a type of compression is enabled. For example, the logic 456, 458, 460 is configured to implement LUT-based encoding scheme to provide compressed repair data at the output 455 (e.g., including compression control data and a compressed version of the memory repair code). The ICG circuitry 442, 444, 446 enables shifting data out of one of the respective registers 434, 436, 438 based on the memory ID.

If a different type of compression is enabled for a respective memory instance other than that implemented by the logic 456, 458 and 460, the direct output path 452 may be selected by output multiplexer 450 (responsive to the CE signal) to provide memory repair code data in the unified repair format at the output 455. The memory repair code data in the unified repair format may be a compressed version in the unified repair format or an uncompressed version. The output 455 is coupled to routing logic 462. For example, the routing logic 462 includes circuitry (e.g., a multi-path switch circuit) configured to couple the output 455 to an input of encoding logic 466 (e.g., implemented as part of compression logic 340), or to bypass the encoding logic 466 and to send the output 455 to an output 464 of the logic 432. The output 464 may be coupled to non-volatile memory controller (e.g., memory controller 120, 206) for storing repair data (compressed or uncompressed) in non-volatile memory, as described herein.

In an example, the encoding logic 466 is configured to implement RLE on the memory repair code data retrieved from the registers 434, 436, 438 through path 452. In another example, another form of encoding may be implemented by the encoding logic 466. As an example, the BISR circuitry 302 may be configured to implement multiple forms of compression for memory repair codes, such as including LUT-based encoding and run-length encoding. In other examples, more than two types of encoding could be used to generate compressed repair data at output 464, such as by configuring routing logic 450 to provide the repair data to additional encoding logic blocks (not shown). When one or more forms of compression are enabled in the BISR circuitry 302, the amount of data stored in the non-volatile memory may be reduced. As a result, the non-volatile memory (NVM 114, 208) may be formed with a reduced area on an SoC compared to existing approaches.

Figure 5:
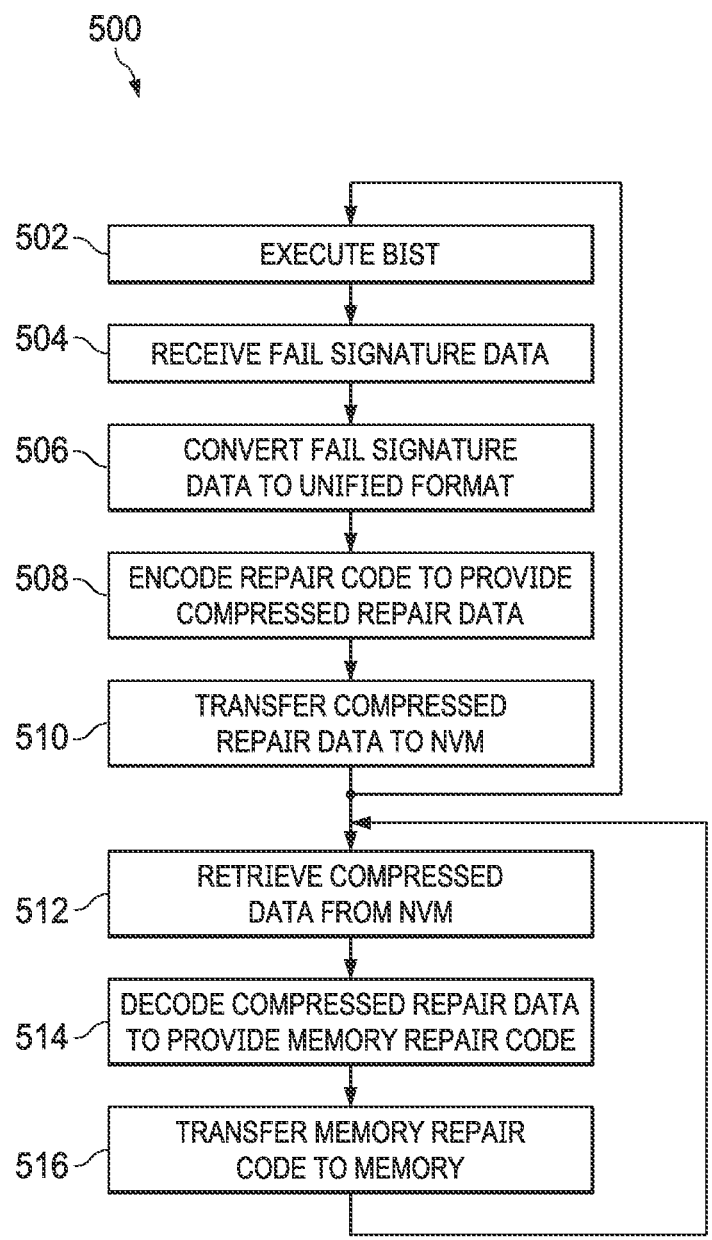
FIG. 5 is a flow diagram showing a method for memory repair with compression and decompression.

FIG. 5 is a flow diagram showing an example method 500 for implementing BISR functionality in an IC, such as IC 100 described herein. At 502, the method 500 includes executing a built-in self-test within a processor core that includes a respective memory instance to generate the fail signature data for the respective memory instance. For example, BIST circuitry 204, 320 may execute test routines for memory instances of one or more processor cores, as shown in FIGS. 2 and 3 and provide the fail signature data to identify locations of defective memory elements of the respective memory instances. As described herein, the memory instances may be embedded memories of a processor core, such as memories 104, 106, 210-218, 304-308.

At 504, the fail signature data is received. For example, fail signature data for a respective memory instance may be received at an input BISR circuitry implemented as part of a memory repair controller (e.g., repair controller 102, 202, 302) implemented on the IC. At 506, the fail signature data for the respective memory instance is converted into a unified repair format. For example, as described herein, repair controller 102, 202, 302 includes align and merge logic 324 configured to convert the fail signature data into a unified format for diverse types of memory instances that may be implemented.

At 508, the fail signature data in the unified repair format is encoded (compressed) to provide compressed repair data. For example, as described herein, the repair controller includes compression logic 112, 240, 328, 340 configured to encode the memory repair code data into a compressed data format. In an example, BISR circuitry implements a given type of encoding logic that may be selected from a plurality of available instances of encoding logic. At 510, the compressed repair data is transferred to a non-volatile memory. For example, NVM controller 120, 206 is configured to transfer the compressed repair data from a respective shadow register into non-volatile memory 114, 208 for storage. The method 500 may repeat at 502-510 for each of the memories so that compressed repair data is stored in the non-volatile memory 114, 208 for each of the respective memories.

At 512, the method includes retrieving compressed data from the non-volatile memory. For example, as described herein, NVM controller 120, 206 is configured to read the compressed repair data from non-volatile memory 114, 208, such as at power-up for the IC. At 514, the compressed repair data is decoded into memory repair code data. For example, as described herein, NVM controller 120, 206 includes decompression logic 130, 264 configured to decompress the compressed repair data into the memory repair code data for use by the respective memory instance. At 516, the memory repair code data is transferred to the respective memory instance. For example, as described herein, NVM controller 120, 206 is coupled to the respective memory and configured to shift the decompressed memory repair code data into memory cells for use in repairing the respective memory instance. The method 500 may repeat 512-516 for each of the memory instances so that repair code data is transferred for repairing of each of the respective memories. As a further example, the In view of the foregoing examples, systems and methods are described to implement non-volatile memory compression for memory repair. The approach allows a lossless compression and decompression of repair codes while reducing the number of bits needed to be stored in non-volatile memory. Additionally, the systems provide area efficient solutions by enabling storage space in the non-volatile memory to be reduce through the compression techniques disclosed herein. In examples where the logic to perform compression and decompression is implemented at a wrapper instead of within the NVM controller, the approach is backwards compatible with existing/legacy systems. Moreover, the approach has little or no impact on external testing systems and repair software In this application, the term "couple" or "couples" means either an indirect or direct connection. Thus, if a first device couples to a second device, that connection may be through a direct connection or through an indirect connection via other devices and connections. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An integrated circuit device comprising:
    a first memory configured to provide a first set of defect data in a first format that specifies whether a portion of the first memory contains a defect;
    a second memory configured to provide a second set of defect data in a second format that specifies whether a portion of the second memory contains a defect, wherein the second format is different from the first format; and
    a controller coupled to the first memory and to the second memory and configured to:
        convert each of the first set of defect data and the second set of defect data to a third format;
        determine a first set of repair data for the first memory based on the first set of defect data in the third format; and
        determine a second set of repair data for the second memory based on the second set of defect data in the third format.

2. The integrated circuit device of claim 1, wherein:
    the second memory includes a set of repair cells; and
    the third format is based on a count of the set of repair cells of the second memory.

3. The integrated circuit device of claim 1, wherein:
    the second memory has a repair signature format; and
    the third format is based on a length of the repair signature format of the second memory.

4. The integrated circuit device of claim 1, wherein the controller is configured to pad a value in the first set of defect data to produce the first set of defect data in the third format.

5. The integrated circuit device of claim 1, wherein:
    the first memory includes a repair cell; and
    the first set of repair data specifies a remapping of an address of a defective element to the repair cell.

6. The integrated circuit device of claim 1, wherein the controller includes compression circuitry configured to compress the first set of repair data.

7. The integrated circuit device of claim 6, wherein:
    the compression circuitry is a first set of compression circuitry;
    the first set of compression circuitry is configured to apply a first compression technique to the first set of repair data; and
    the controller includes a second set of compression circuitry configured to compress the second set of repair data by applying a second compression technique that is different from the first compression technique.

8. The integrated circuit device of claim 7, wherein:
    the first compression technique is a look-up table compression technique; and
    the second compression technique is a run-length encoding compression technique.

9. The integrated circuit device of claim 6 further comprising a third memory, wherein the controller is configured to store the compressed first set of repair data in the third memory.

10. The integrated circuit device of claim 1, wherein the controller is configured to determine the second set of repair data by:

splitting the second set of defect data into a first portion associated with a first repair cell and a second portion associated with a second repair cell;

determining a first portion of the second set of repair data based on the first portion of the second set of defect data; and determining a second portion of the second set of repair data based on the second portion of the second set of defect data.

11. The integrated circuit device of claim 1, wherein the first set of defect data includes an identifier of the first memory.

12. An integrated circuit device comprising:
a controller that includes:
alignment circuitry configured to:
receive a first set of defect data that specifies whether a portion of a first memory contains a defect, wherein the first set of defect data has a first width;
receive a second set of defect data that specifies whether a portion of a second memory contains a defect, wherein the second set of defect data has a second width that is different from the first width; and
convert each of the first set of defect data and the second set of defect data to have a third width; and
repair circuitry coupled to the alignment circuitry and configured to:
determine a first set of repair data for the first memory based on the first set of defect data; and
determine a second set of repair data for the second memory based on the second set of defect data.

13. The integrated circuit device of claim 12, wherein the controller further includes compression circuitry coupled to the repair circuitry and configured to:
compress the first set of repair data to produce a first compressed set of repair data; and
compress the second set of repair data to produce a second compressed set of repair data.

14. The integrated circuit device of claim 13, wherein the controller further includes:
a first register associated with the first memory and configured to store the first compressed set of repair data; and a second register associated with the second memory and configured to store the second compressed set of repair data.

15. The integrated circuit device of claim 14, wherein:
the compression circuitry is a first set of compression circuitry; and
the controller further includes a second set of compression circuitry coupled to the first register and to the second register.

16. A method comprising:
receiving a first set of defect data in a first format that specifies whether a portion of a first memory contains a defect;
receiving a second set of defect data in a second format that specifies whether a portion of a second memory contains a defect, wherein the second format is different from the first format;
converting each of the first set of defect data and the second set of defect data to a third format;
determining a first set of repair data for the first memory based on the first set of defect data in the third format; and
determining a second set of repair data for the second memory based on the second set of defect data in the third format.

17. The method of claim 16, wherein:
the second memory includes a set of repair cells; and
the third format is based on a count of the set of repair cells of the second memory.

18. The method of claim 16, wherein:
the second memory has a repair signature format; and
the third format is based on a length of the repair signature format of the second memory.

19. The method of claim 16, wherein:
the first memory includes a repair cell; and
the first set of repair data specifies a remapping of an address of a defective element to the repair cell.

20. The method of claim 16 further comprising:
compressing the first set of repair data to produce a first compressed set of repair data;
compressing the second set of repair data to produce a second compressed set of repair data; and
storing the first compressed set of repair data and the second compressed set of repair data in a memory.

* * * * *